United States Patent [19]

Morozumi

[11] 3,889,211

[45] June 10, 1975

[54] MOS FIELD EFFECT TRANSISTOR CRYSTAL OSCILLATOR

[75] Inventor: Shinji Morozumi, Shimosuwa-machi, Japan

[73] Assignee: Kabushiki Kaisha Suwa Seikosha, Tokyo, Japan

[22] Filed: Aug. 28, 1973

[21] Appl. No.: 392,407

[30] Foreign Application Priority Data

Aug. 28, 1972 Japan .............................. 47-85270

[52] U.S. Cl. .............................. 331/116 R; 58/23 A

[51] Int. Cl. .............................. H03b 5/36

[58] Field of Search ............ 331/116 R, 108 D, 158, 331/159; 58/23 R, 23 A, 23 AC; 307/304, 303

[56] References Cited

UNITED STATES PATENTS

| | | | |
|---|---|---|---|
| 3,568,091 | 3/1971 | Rahe | 331/116 R X |
| 3,676,801 | 7/1972 | Musa | 331/116 R |
| 3,678,293 | 7/1972 | Popper | 307/304 X |
| 3,757,510 | 9/1973 | Dill | 58/23 R |

*Primary Examiner*—Siegfried H. Grimm

*Attorney, Agent, or Firm*—Blum, Moscovitz, Friedman & Kaplan

[57] ABSTRACT

A quartz crystal oscillator circuit for use in electronic timepieces and capable of self-oscillation at a constant operating point in response to a self-biasing circuit is provided. MOS field effect transistor means are provided for feeding back the output voltage of a drain terminal of a cascaded series of inverter stages comprised of MOS field effect transistors to the input of a gate terminal of such cascaded inverter stages to provide self bias to the cascaded inverter circuit. The feed-back resistance of the MOS field effect transistor means is used to set the operating point of the circuit when a high resistance is required. The use of MOS field effect transistors therein also provides increased stability of the oscillating frequency during fluctuations in temperature.

6 Claims, 6 Drawing Figures

MOS FIELD EFFECT TRANSISTOR CRYSTAL OSCILLATOR

BACKGROUND OF THE INVENTION

This invention relates generally to an improved quartz crystal oscillator circuit for use in an electronic timepiece and especially to a quartz crystal oscillator circuit for stabilizing the oscillating frequency thereof by the use of an MOS field effect transistor feed-back loop. While quartz crystal oscillator circuits have taken various forms, such circuits have attempted to stabilize the operating point thereof by feeding back the output of a series cascaded inverter stage circuit to the input of such cascaded inverter stage circuit to set the bias thereof. For such bias to be effective,, the resistance must be of an extremely high magnitude such as on the order of several megohms. It has heretofore been the practice to physically couple a large resistor to an integrated circuit or to produce a hybrid integrated circuit using a thin film resistance. Because of the large number of contacts effected by both methods, reliability cannot be maintained due to the faults caused by such contacts. Accordingly, it has been found desirable to include such a bias circuit in the integrated circuitry which forms the quartz crystal oscillator circuit to thereby form a monolithic integrated circuit. However, when such a diffused layer has been utilized, the specific resistance thereof is limited by the small area limitations in an electronic timepieces and the necessarily large order of resistance required, rendering such space requirements difficult to achieve. Moreover when polycrystalline silicon is used in the manufacture of such diffused layers to reduce the size thereof, the use thereof causes instability in the oscillating frequency characteristics.

SUMMARY OF THE INVENTION

Generally speaking, in accordance with the invention, a quartz crystal oscillator circuit is provided with a high resistance feed-back bias circuit which includes integrated circuit MOS field effect transistors. The quartz crystal oscillator circuit is formed in which odd-staged complementary integrated circuit field effect transistor invertor stages are cascaded and in which a quartz crystal vibrator is connected between the last stage output drain terminal of said cascaded inverter stages and a gate terminal of the input stage of said cascaded inverters to form a feed-back circuit therebetween. A bias circuit is further provided and is comprised of at least one integrated circuit field effect transistor having a drain terminal thereof coupled to an output drain connecting terminal of a cascaded inverter stage and the source terminal thereof coupled to the input gate terminal of the cascaded inverter stages to provide a further feed-back loop.

Accordingly, it is an object of this invention to provide an improved quartz crystal oscillator circuit having a low manufacturing cost and small size for inclusion in small sized electronic timepieces.

It is a further object of this invention to provide an improved quartz crystal oscillator circuit wherein the oscillation thereof is stabilized against changes in temperature.

It is still another object of this invention to provide a quartz crystal oscillator circuit formed of MOS field effect transistors to provide for improved reliability and simplified manufacturing thereof.

Still other objects and advantages of the invention will in part be obvious and will in part be apparent from the specification.

The invention accordingly comprises the features of construction, combinations of elements, and arrangement of parts which will be exemplified in the constructions hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

Figure 1:
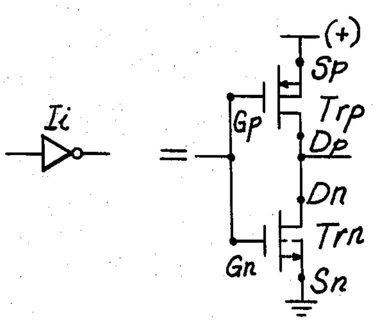
FIG. 1 is a circuit diagram of an inverter circuit comprised of complementary MOS field effect transistors which inverters are included in the instant invention.
Figure 2:
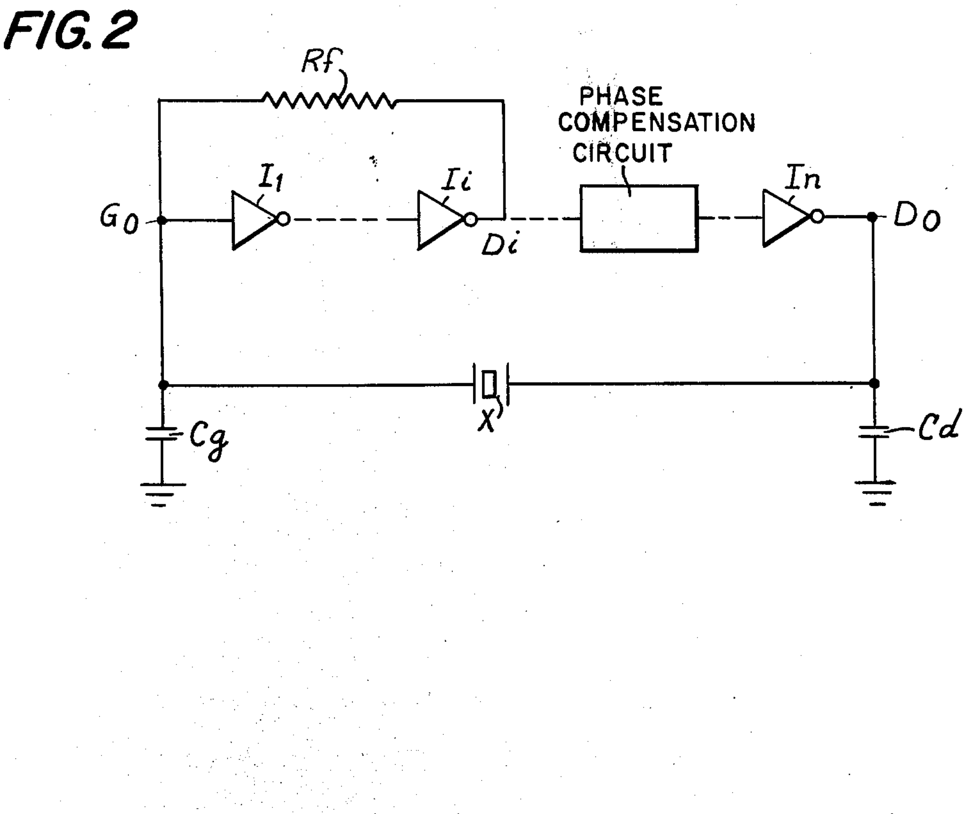
FIG. 2 is a circuit diagram of a quartz crystal oscillator circuit including the inverter circuits illustrated in FIG. 1.

A quartz crystal oscillator circuit is depicted in FIG.2 and includes complementary inverter circuit states $I_l$ through $I_n$, where n is an odd integer. The complementary inverter circuits $I_l$ through $I_n$, as depicted in FIG. 1, are comprised of a complementary connection of an MOS P-channel field effect transistor $T^r{}_p$ and an MOS N-channel field effect transistor $T^r{}_n$ by coupling the gate electrodes $G_p$ and $G_n$ together to form a first terminal and the drain electrodes $D_p$ and $D_n$ together to form a second terminal and by further fixing the source terminal of transistor $T^r{}_n$ to a reference potential such as ground and the source electrode of transistor $T^r{}_p$ to a positive voltage source.

The N-stage cascade connection of complementary inverters $I_l$ to $I_n$ includes a phase compensation circuit P.C arbitrarily disposed after any inverter stages in the n-stage cascaded connection, such as $I_i$, as depicted in FIG. 2. The output terminal $D_o$ of the cascaded connection of complementary inverters corresponds to the drain electrodes discussed above with respect to FIG. 1. Similarly, an input terminal of the n-stage cascaded connection of complementary inverters, $G_o$, corresponds to the gate electrode of complementary inverter stage $I_l$ depicted in FIG. 2. The drain output terminal $D_o$ is coupled to the input terminal $G_o$ through a feed-back circuit comprised of a quartz crystal vibrator X. The drain output terminal $D_o$ is further connected to ground through an output capacitor $C_d$ and input gate terminal $G_o$ is similarly connected to ground through an input capacitor $C_g$, such capacitance connections effecting phase compensation of the circuit.

In order to establish the operating point of the cascaded connection of complementary inverter circuits, a feed-back circuit comprised of a resistor $R_f$ is coupled to the drain output terminal $D_l$ of an arbitrarily selected inverter stage $I_l$ and is further coupled to the input gate terminal $G_o$ of the cascaded inverter circuit. The resistor $R_f$ self biases the complementary inverter stages to thereby effect self-oscillation of the quartz crystal oscillator circuit. To achieve such an effect, the resistance $R_f$ must be of an extremely large magnitude such as several megohms, such resistance being of as large an order as possible without influencing the phase relationship of the circuit. As mentioned hereinabove, it is desired to produce a resistance means of such a magnitude which resistance means is part of the crystal oscillator circuit in the form of a monolithic integrated circuit element a feature which has not yet been realized in view of the defects pointed out above.

Figure 3:
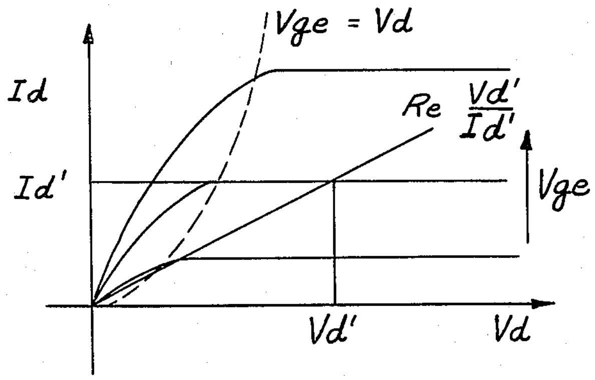
FIG. 3 is a graph of the drain electrode current-voltage characteristics of MOS field effect transistors which transistors are utilized in the preferred embodiment of the instant invention.

Such defects have been eliminated in the instant invention by the utilization of MOS field effect transistors due to their inherent feature of channel resistance which is of a high magnitude. To appreciate such use, it is helpful to understand the relation between the current and voltage of an MOS field effect transistor. Two basic relationships for all MOS field effect transistors are:

$0 < V_d < V_{ge}$; $I_d = \beta(V_{ge} V_d - 1/2\, V_d^2)$ $V_{ge} < V_d$; $I_d = 1/2 \beta\, V_{ge}^2$ where, $V_{ge}$ is the effective gate voltage at the gate electrode, $V_d$ is the drain voltage at the drain electrode; $I_d$ is the drain current; and $\beta$ equals $\mu$, $C_{ox}$. $W/L$, where $\mu$ is the mobility on a channel surface; $C_{ox}$ is the capacitance per unit area of a gate insulating film; and $W/L$ is the ratio of width to length of the channel. In such a case, if reference is made to FIG. 3, it is illustrated therein that an equivalent resistance of the MOS field effect transistor is equal to $V_d/I_d$, and the minimum resistance $Re_{mini}$ is achieved when $V_d = 0$ and as is shown in FIG. 3:

$$Re = V_d/I_d = 1/\beta(V_{ge} - 1/2V_d)$$

$$Re_{mini} = 1/\beta . V_{ge}$$

According to the above formula, a resistance of at least several megohms is easily attainable if the ratio of $W/L$ (width to length) is set small enough since $\beta \alpha W/L$. The above formula applies when the effective gate voltage $V_{ge}$ is fixed. But, even when the effective gate voltage $V_{ge}$ is changed in response to the drain voltage $V_d$, the effective resistance $Re$ is inversely proportional to the ratio $W/L$ of the width to length of the channel. In fact when the mobility is approximately 600 centimeters$^2$/V-sec on the N-channel side and approximately 300 cm$^2$/V-sec on the P-channel side, the gate capacitance, $C_{ox}$, per unit area is $3 \times 10^{-8}$ F/cm$^2$ and the effective gate voltage $V_{ge}$ is .5 volts on the N-channel side, a minimum effective resistance of 5 megohms can be easily obtained within a very small area by lowering the ratio $W/L$ of width to length of the channel to not more than 0.02 on the N-channel side not more than 0.075 on the P-channel side. Moreover, with respect to the temperature characteristics, greater reliability is attained by such a modification if polycrystalline silicon resistors are utilized since the increase of temperature T in such MOS field effect transistors reduces the mobility which increases the effective gate voltage $V_{ge}$, the corresponding increases and reductions negating each other.

Figure 4:
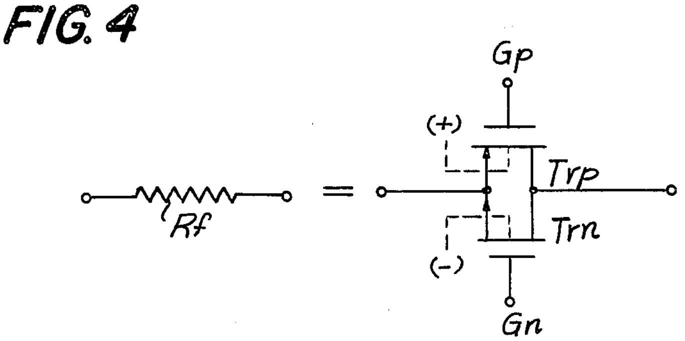
FIG. 4 is a circui diagram of a resistance feed-back element comprised of MOS field effect transistors which are utilized in the preferred embodiment of the instant invention.
Figure 5:
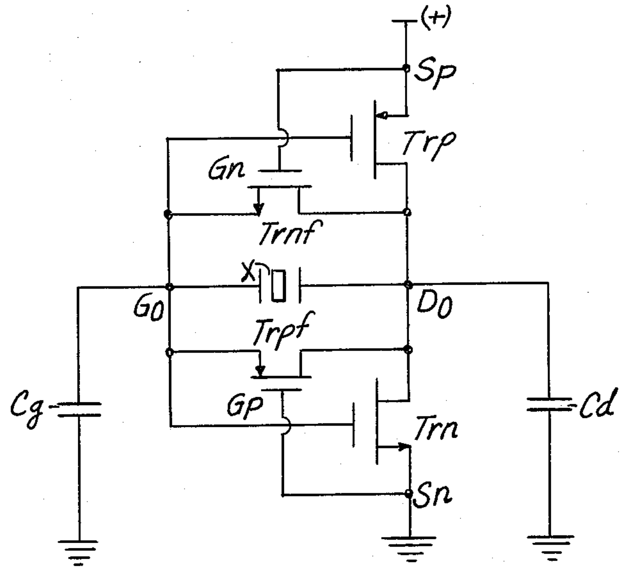
FIG. 5 is a circuit diagram of a quartz crystal oscillator circuit constructed in accordance with the preferred embodiment of the instant invention.

Referring now to FIGS. 4 and 5 a preferred embodiment of the instant invention is depicted. In FIG. 4 the connection of an N-channel transistor $Tr_n$ and a P-channel transistor $Tr_p$ is shown, the transistors being connected in parallel to form a circuit which is equivalent to the resistor $R_f$ illustrated in FIG. 2. This parallel connection is incorporated into the circuit of FIG. 5 which is a quartz crystal oscillator circuit comprised of a one stage complementary inverter circuit and wherein like reference letters are used to depict like elements. The inverter stage includes MOS field effect transistors $Tr_p$ and $Tr_n$ coupled in the same manner as depicted in FIG. 1 with a quartz crystal vibrator X coupled to the drain output terminal $D_o$ and further coupled to gate input terminal $G_o$. As stated above, the biasing circuit includes the parallel connection of MOS field effect transistors $Tr_{nf}$ and $Tr_{pf}$ with the source terminals thereof coupled to the gate input terminal of the inverter stage, the drain electrodes thereof coupled to the drain output terminal of the inverter stage and the gate electrodes thereof coupled the source electrodes of the inverter circuit to provide direct coupling thereof to a potential source.

Figure 6:
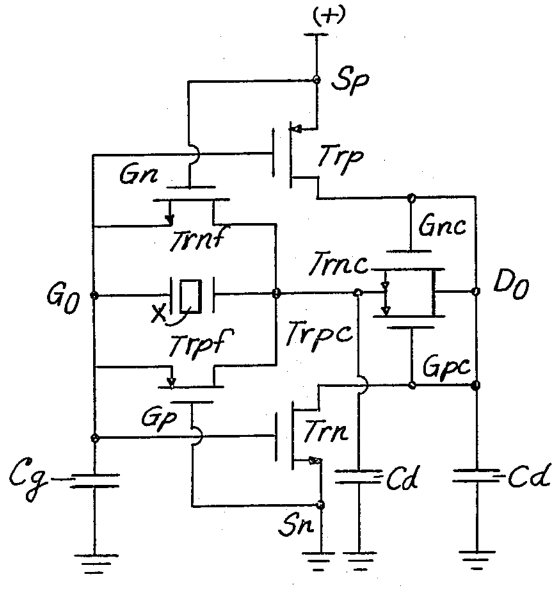
FIG. 6 is a circuit diagram of a quartz crystal oscillator circuit of FIG. 5 in further combination with a phase circuit formed of MOS field effect transistors.

When potentials of opposite polarity are applied to gate electrodes $G_n$ and $G_p$, the oscillation of the circuit is increased rapidly. The parallel connection of $Tr_{pf}$ and $Tr_{nf}$ has an effective large resistance due to the coupling of the drain electrodes and source electrodes of $Tr_p$ and $Tr_n$ in the manner described above. In the circuit depicted in FIG. 5, when the gate terminals $G_n$ and $G_p$ of transistors $Tr_{nf}$ and $Tr_{pf}$ are respectively maintained at opposite potentials, both transistors are simultaneously turned on. However, when the alternating potential signal of the output drain terminal $D_0$ and the input gate terminal $G_0$ are applied to the gates of transistors $Tr_{nf}$ and $Tr_{pf}$ the transistors are alternately turned on for each half period of the alternating polarity potential applied to the gate and drain terminals. A further utilization of MOS field effect transistors is illustrated in FIG. 6 wherein a phase compensation circuit is inserted into the circuit of FIG. 5 in order to utilize a drain parasitic capacitor $C_d$ with an MOS field effect transistor. Gate electrodes $G_{nc}$ and $G_{pc}$ of transistors $Tr_{nc}$ and $Tr_{pc}$ are coupled to the drain output terminal $D_0$, the transistors providing an equivalent resistance in combination with capacitor $C_d$ to provide a RC phase compensation circuit. If the capacitor were to be incorporated into an integrated circuit chip for use in an electronic timepiece, such manufacture can be achieved and requires only a one piece quartz crystal and a frequency regulating capacitor to be attached thereto to reduce the size and cost and provide increased reliability to a timepiece utilizing such integrated circuitry.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A quartz crystal oscillator circuit comprising a cascaded inverter circuit said cascade circuit including *n* complementary inverter stages connected in cascade, where *n* is an odd integer, and having an output terminal at the output of a last stage and an input terminal at the input of a first stage, a quartz crystal vibrator coupled between said last stage output and said first stage input to form a feed-back circuit therebetween, and biasing means in said feed-back circuit for setting the operating point of said oscillator circuit, said biasing means including two complementary parallel coupled integrated circuit field effect transistors, the source electrodes thereof being coupled to said input terminal and the drain electrodes thereof being coupled to said output terminal.

2. A quartz crystal oscillator circuit as claimed in claim 1, wherein each of said inverter stages includes at least one pair of complementary integrated MOS field effect transistors and including means for controlling phase at the output side of at least one of said inverter stages so as to apply a bias voltage to said circuit through said phase controlling means.

3. A quartz crystal oscillator circuit as recited in claim 2, wherein said phase controlling means comprises at least a pair of complementary parallel connected MOS transistors.

4. A quartz crystal oscillator circuit comprising a quartz crystal vibrator, at least one inverter stage having a drain output terminal at the last stage thereof and a gate input terminal at the first stage thereof with said at least one stage including a complementary coupling of a P-channel transistor and an N-channel transistor, the drain output terminal being coupled to the gate input terminal through the connection of said quartz crystal vibrator to said terminals, capacitor means coupled between said output drain terminal and ground and further capacitor means coupled between the gate input terminal of the first stage and ground, two further complementary parallel coupled field effect transistors, and said gate input terminal being coupled through said further field effect transistors to said drain output terminal to set a stable operating point for said oscillating complementary transistors.

5. A quartz crystal oscillator circuit comprising a quartz crystal vibrator, at least one inverter stage having a drain output terminal at the last stage thereof and a gate input terminal at the first stage thereof with said at least one stage including a complementary coupling of a P-channel transistor and an N-channel transistor, feed-back circuit means including impedance means coupled in parallel to said quartz crystal vibrator,two further parallel coupled field effect transistors coupled in series with said parallel coupled quartz crystal vibrator and impedance means, and capacitor means coupled between ground and a node defining the series coupling of said quartz crystal vibrator with said further transistors, said drain output terminal being coupled through said feed-back circuit means to said gate input terminal.

6. A quartz crystal oscillator circuit as recited in claim 5, wherein said impedance means includes a pair of parallel connected MOS field effect transistors.

* * * * *